(12) United States Patent
Kong et al.

(10) Patent No.: US 11,315,459 B2
(45) Date of Patent: Apr. 26, 2022

(54) GATE DRIVER AND DISPLAY PANEL HAVING THE SAME

(71) Applicant: LG Display Co., Ltd., Seoul (KR)

(72) Inventors: ChungSik Kong, Paju-si (KR);
HongGyu Han, Paju-si (KR); MiHee Shin, Goyang-si (KR); SeWan Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/039,544

(22) Filed: Jul. 19, 2018

(65) Prior Publication Data

US 2019/0096306 A1    Mar. 28, 2019

(30) Foreign Application Priority Data

Sep. 26, 2017 (KR) .......................... 10-2017-0123954

(51) Int. Cl.
*G11C 19/00* (2006.01)
*G09G 3/20* (2006.01)
(Continued)

(52) U.S. Cl.
CPC ............. *G09G 3/20* (2013.01); *G09G 3/3677* (2013.01); *G09G 3/3266* (2013.01); *G09G 2300/0408* (2013.01); *G09G 2310/0267* (2013.01); *G09G 2310/0286* (2013.01); *G09G 2310/0289* (2013.01); *G09G 2310/08* (2013.01)

(58) Field of Classification Search
None
See application file for complete search history.

(56) References Cited

U.S. PATENT DOCUMENTS 6,556,646 B1     4/2003  Yeo et al.
8,964,932 B2 *   2/2015  Wu ...................... G09G 3/3266
                                                  377/64
(Continued)

FOREIGN PATENT DOCUMENTS

CN        1677575 A    10/2005
CN      101388197 A     3/2009
(Continued)

OTHER PUBLICATIONS

First Notification of Office Action dated Jun. 22, 2021, issued in corresponding Chinese Patent Application No. 201810662028.X.

*Primary Examiner* — Tuan T Lam
(74) *Attorney, Agent, or Firm* — Morgan, Lewis & Bockius LLP

(57) ABSTRACT

A display panel includes pixels connected to gate lines, and a gate driver that supplies a gate signal to at least one of the gate lines and includes a plurality of stages. Each stage includes a pull-up transistor to apply a turn-on voltage of a first clock signal to an output terminal responsive to a voltage at a Q-node, a pull-down transistor to apply a turn-off voltage to the output terminal responsive to a voltage at a QB-node that holds the turn-on voltage during a period in which the output terminal is applied the turn-off voltage, and a QB-node control unit to apply the turn-on voltage to the QB-node responsive to the first clock signal and a second clock signal in reverse-phase with the first clock signal. Accordingly, a display panel may include a gate driver that can set, reset, and hold the voltage at a QB-node.

6 Claims, 11 Drawing Sheets

(51) Int. Cl.
*G09G 3/36* (2006.01)
*G09G 3/3266* (2016.01)

(56) References Cited

U.S. PATENT DOCUMENTS

| | | | | |
|---|---|---|---|---|
| 10,140,913 B2* | 11/2018 | Chen | ........................ | G09G 3/22 |
| 2004/0140389 A1* | 7/2004 | Moratto | ............ | A47K 10/3836 |
| | | | | 242/597.6 |
| 2005/0220262 A1* | 10/2005 | Moon | ..................... | G11C 19/28 |
| | | | | 377/64 |
| 2005/0220263 A1 | 10/2005 | Moon | | |
| 2007/0046327 A1* | 3/2007 | Wei | ........................ | G11C 19/28 |
| | | | | 326/46 |
| 2008/0001904 A1* | 1/2008 | Kim | ..................... | G09G 3/3677 |
| | | | | 345/100 |
| 2008/0219401 A1* | 9/2008 | Tobita | ..................... | G11C 19/28 |
| | | | | 377/79 |
| 2008/0253499 A1* | 10/2008 | Chan | ..................... | G11C 19/28 |
| | | | | 377/68 |
| 2012/0262438 A1* | 10/2012 | Shang | ..................... | G11C 19/28 |
| | | | | 345/211 |
| 2014/0253424 A1 | 9/2014 | Yu et al. | | |
| 2015/0043703 A1* | 2/2015 | Tan | ........................ | G11C 19/184 |
| | | | | 377/68 |
| 2016/0071614 A1 | 3/2016 | Lee | | |
| 2016/0133184 A1* | 5/2016 | Gupta | ..................... | G09G 3/3233 |
| | | | | 345/690 |
| 2017/0154565 A1* | 6/2017 | Qing | ..................... | G11C 19/28 |
| 2017/0186393 A1* | 6/2017 | Wang | ..................... | G09G 3/36 |
| 2017/0278473 A1* | 9/2017 | Shang | ..................... | G09G 3/36 |
| 2017/0316751 A1* | 11/2017 | Wang | ..................... | G11C 19/28 |
| 2018/0226039 A1* | 8/2018 | Han | ..................... | G09G 3/3648 |
| 2018/0268755 A1* | 9/2018 | Chen | ..................... | G09G 3/22 |
| 2018/0335814 A1* | 11/2018 | Shao | ..................... | G06F 1/24 |
| 2019/0206502 A1* | 7/2019 | Lim | ..................... | G09G 3/20 |

FOREIGN PATENT DOCUMENTS

| | | |
|---|---|---|
| CN | 105405417 A | 3/2016 |
| CN | 205282053 U | 6/2016 |
| CN | 106910450 A | 6/2017 |

\* cited by examiner

GATE DRIVER AND DISPLAY PANEL HAVING THE SAME

CROSS-REFERENCE TO RELATED APPLICATIONS

This application claims the priority of Korean Patent Application No. 10-2017-0123954 filed on Sep. 26, 2017, in the Korean Intellectual Property Office, the disclosure of which is incorporated herein by reference.

BACKGROUND

Technical Field

The present disclosure relates to a gate driver and a display panel including the same, and more specifically, to a gate driver that can be formed directly in a display panel, thereby reducing the bezel of the display panel, and a display panel including the same.

Discussion of the Related Art

Currently, various display devices are being developed and released. For example, display devices include a liquid-crystal display device (LCD), a field emission display device (FED), an electrophoretic display device (EPD), an electro-wetting display device (EWD), an organic light-emitting display device (OLED), and a quantum dot display device (QD).

A display device includes a display panel including a plurality of sub-pixels, a driver unit for driving the display panel, a power supply unit for supplying power to the display panel, etc. The driver unit includes a scan driver for supplying a scan signal (or a gate signal) to the display panel, and a data driver for supplying a data signal to the display panel.

A display device can display an image by supplying a scan signal, a data signal, etc. so that selected sub-pixels emit light. Accordingly, a technique is under development for improving the accuracy of a driver unit included in a display panel to accurately transmit signals to sub-pixels.

SUMMARY

A display panel is driven using one or more scan signals. A display panel includes an active area in which a pixel array, which is a set of sub-pixels, is disposed to display images, and a non-active area in which no image is displayed. The sub-pixels are driven using one or more scan signals. A gate driver to supply scan signals may be embedded in a display panel in the form of thin-film transistors together with a pixel array. Such a gate driver embedded in the display panel is known as a GIP (Gate In Panel) circuit. The GIP circuit may be implemented as a shift register. The shift register includes a plurality of stages, and the plurality of stages generates an output upon receiving a start signal. The output maybe shifted according to a clock signal. The gate driver includes stages each including a plurality of thin-film transistors (or transistors). The stages are cascaded to generate outputs sequentially. The number of stages of the gate driver may be equal to the number of gate lines. Each of the stages may output a gate signal to the respective gate lines.

Each of the stages includes a Q-node for controlling a pull-up transistor, and a QB-node for controlling a pull-down transistor. Each of the stages may include transistors for charging the Q-node and discharging the QB-node or vice versa in response to a start signal and a clock signal. The start signal may be an output signal from the previous stage.

When the QB-node is charged, the Q-node is discharged, and vice versa. For example, when a high-level voltage is applied to the Q-node, a low-level voltage is applied to the QB-node. When the low-level voltage is applied to the Q-node, the high-level voltage is applied to the QB-node. As the pull-up transistor and pull-down transistor are turned on/off, a gate on/off signal may be provided to the pixel array. Since the pull-down transistor has a turn-on time longer than a turn-off time, it is necessary to stably apply a turn-on voltage to the QB-node. For example, when the transistors of the gate driver are p-type transistors, the turn-on voltage is a gate-low voltage and the turn-off voltage is a gate-high voltage. When a transistor included in a sub-pixel controlled by a gate signal is an n-type transistor, a gate-on signal is a gate-high voltage. When a transistor included in a sub-pixel controlled by a gate signal is a p-type transistor, the gate-on signal is a gate-low voltage. The types of the transistors of the gate driver and the sub-pixels are not limited thereto.

The gate driver may be implemented in various forms, and research is ongoing to develop optimal circuit configuration to improve the reliability of operation.

In view of the above, the inventors of the application have recognized the above-described issues, and have devised a gate driver having improved accuracy of an output signal, and a display panel including the same.

Accordingly, embodiments of the present disclosure are directed to a gate driver and a display panel having the same that substantially obviate one or more of the problems due to limitations and disadvantages of the related art.

An object of the present disclosure is to provide a gate driver including a QB-node control unit for accurately providing a voltage to a QB-node.

Another object of the present disclosure is to provide a display panel with a reduced bezel by forming a gate driver with improved accuracy of an output signal therefrom on the display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display panel comprises pixels connected to gate lines, and a gate driver that supplies a gate signal to at least one of the gate lines and includes a plurality of stages. Each stage includes a pull-up transistor to apply a turn-on voltage of a first clock signal to an output terminal responsive to a voltage at a Q-node, a pull-down transistor configured to apply a turn-off voltage to the output terminal responsive to a voltage at a QB-node that holds the turn-on voltage during a period in which the output terminal is applied the turn-off voltage, and a QB-node control unit to apply the turn-on voltage to the QB-node responsive to the first clock signal and a second clock signal in reverse-phase with the first clock signal. Accordingly, a display panel may includes a gate driver that can set, reset, and hold the voltage at a QB-node.

In another aspect, a gate driver comprises a QB-node control unit to control a QB-node, the QB-node being a gate node of a pull-down transistor. The QB-node control unit comprises a first transistor and a second transistor each having an electrode connected to a QP-node for controlling the QP-node, a third transistor to apply a gate-high voltage to the QB-node, and a fourth transistor having a gate electrode connected to the QP-node to apply a gate-low voltage to the QB-node. The gate driver with improved accuracy of an output signal therefrom can be implemented by a QB-node control unit that can control a QB-node.

The details of one or more embodiments of the subject matter described in this specification are set forth in the accompanying drawings and the description below.

According to embodiments of the present disclosure, a QB-node control unit applies a turn-on voltage of a clock signal to a QP-node by coupling of a capacitor, so that a gate-low voltage is applied to the QB-node to turn on the pull-down transistor and output a gate-off voltage.

According to embodiments of the present disclosure, a QB-node control unit applies a gate-high voltage to a QB-node by a start signal or a voltage at the Q1-node, so that a pull-down transistor is turned off and a pull-up transistor is turned on by a Q-node control unit, to output a gate-on voltage.

According to embodiments of the present disclosure, a QB-node control unit further includes a first capacitor between an input terminal from which a clock signal is input and a QP-node, so that the QP-node is coupled to the clock signal to periodically apply a gate-low voltage to the QP-node. Accordingly, the gate-low voltage can be periodically applied to the QB-node during a holding period.

According to embodiments of the present disclosure, a QB-node control unit further includes a third capacitor connected between a QB-node and an input terminal from which a gate-high voltage is input, so that the voltage charged between a first electrode and a second electrode of the third capacitor in a set period can be held during a holding period.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
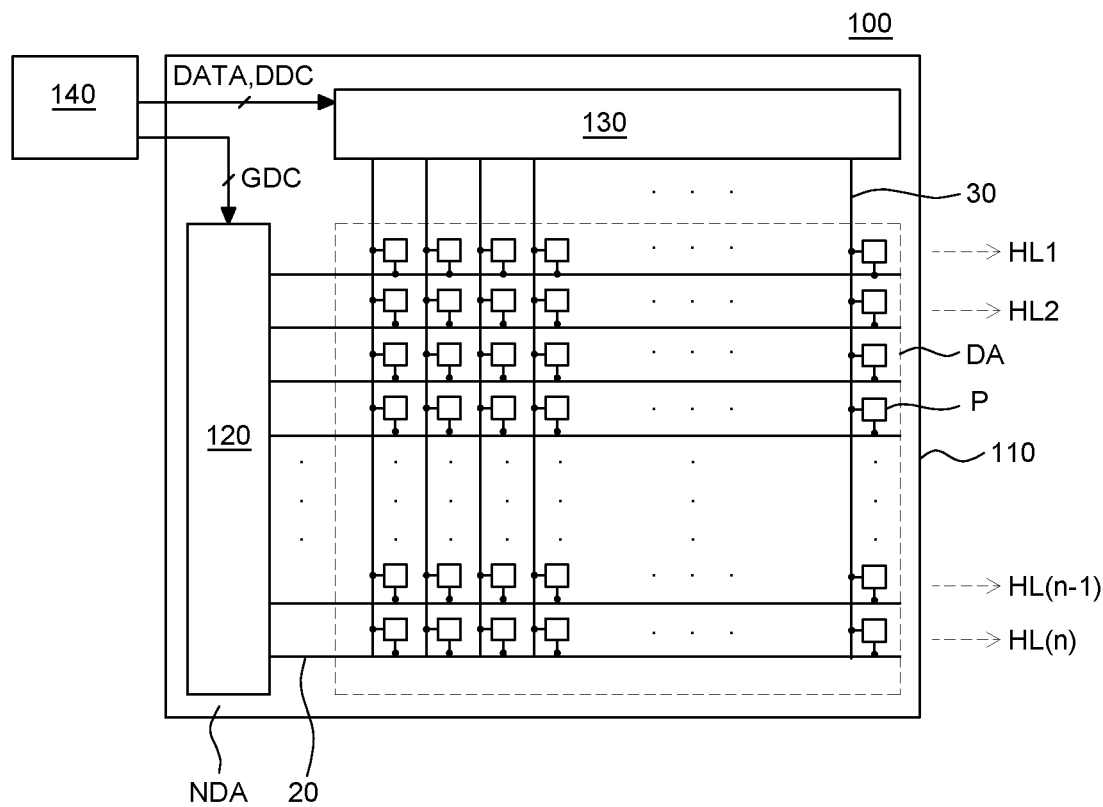
FIG. 1 is a view of a display device according to an embodiment of the present disclosure.

Advantages and features of the present disclosure and methods to achieve them will become apparent from the descriptions of embodiments hereinbelow with reference to the accompanying drawings. However, the present disclosure is not limited to embodiments disclosed herein but may be implemented in various different ways. The embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

In describing temporal relationship, terms such as "after," "subsequent to, " "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure. Ordinal numbers used in the detailed description may or may not match the ordinal numbers used for elements in the claims as the claims recite essential elements. For example, a "second capacitor" recited in the claims may correspond to a "third capacitor C3" in the detailed description, and a "third capacitor" recited in the claims may correspond to a "second capacitor C2" in the detailed description.

Features of various embodiments of the present disclosure may be combined partially or totally. As will be clearly appreciated by those skilled in the art, technically various interactions and operations are possible. Various embodiments can be practiced individually or in combination.

Herein, the pixel circuit and the gate driver formed on the substrate of the display panel may be implemented as n-type or p-type transistors. For example, the transistors may be implemented as metal oxide semiconductor field effect transistors (MOSFETs). A transistor is a three-electrode device including a gate electrode, a source electrode, and a drain electrode. The source electrode is an electrode for supplying carriers to the transistor. In the transistor, carriers begin to flow from the source electrode. The carries exit the transistor via the drain electrode. For example, carriers flow in a transistor from the source electrode to the drain electrode. For an n-type transistor, the carriers are electrons, and thus the level of the source voltage is lower than the level of the drain voltage so that the electrons flow from the source electrode to the drain electrode. In an n-type transistor, as electrons flow from the source electrode to the drain electrode, the current flows from the drain electrode to the source electrode. For a p-type transistor, the carriers are holes, and thus the level of the source voltage is higher than the level of the drain voltage so that the holes flow from the source electrode to the drain electrode. In a p-type transistor, as holes flow from the source electrode to the drain electrode, the current flows from the source electrode to the drain electrode. The source electrode and the drain electrode of a transistor are not fixed but may be interchanged according to the applied voltage.

In the following description, a gate on voltage may refer to the voltage of a gate signal to turn on a transistor. A gate off voltage may refer to the voltage to turn off a transistor. In a p-type transistor, the gate-on voltage may be a gate-low voltage (VL), and the gate-off voltage may be a gate-high voltage (VH). In an n-type transistor, the gate-on voltage may be a gate-high voltage (VH), and the gate-off voltage may be a gate-low voltage (VL).

Hereinafter, a gate driver and a display panel including the same according to embodiments of the present disclosure will be described in detail with reference to the accompanying drawings.

FIG. 1 is a view of a display device according to an embodiment of the present disclosure.

Referring to FIG. 1, a display device 100 includes a display panel 110, a gate driver 120, a data driver 130, and a timing controller 140.

The display panel 110 includes sub-pixels P connected to gate lines 20 and data lines 30. The display panel 110 is sealed to protect at least one film or substrate, and sub-pixels formed on the film or substrate from moisture or external air such as oxygen.

The display panel 110 includes a display area DA where sub-pixels P are formed, and a non-display area NDA formed around the display area DA where various signal lines, pads, etc. are formed. As the display area DA is for displaying images, the sub-pixels are disposed therein. As the non-display area NDA displays no image, dummy sub-pixels are disposed therein or no sub-pixel is disposed therein.

The display area DA includes a plurality of sub-pixels P, and displays an image based on the grayscale represented by each of the sub-pixels P. The sub-pixels P are arranged along first to $n^{th}$ pixel lines HL1 to HL(n). Each of the sub-pixels P is connected to a data line arranged along a column line and connected to a gate line arranged along the pixel line HL. The sub-pixels arranged on the same pixel line share the same gate line and are simultaneously driven. Herein, the sub-pixels P arranged in the first pixel line HL1 are defined as first sub-pixels, and the sub-pixels P arranged in the $n^{th}$ pixel line HL (n) are defined as $n^{th}$ sub-pixels. The first to $n^{th}$ sub-pixels are driven sequentially.

The sub-pixels P of the display panel 110 are arranged in a matrix to form a pixel array. It is, however, to be understood that the present disclosure is not limited thereto. The sub-pixels P may be arranged in various ways, e.g., such that they share pixels, or in a stripe shape, in a diamond shape, etc. in addition to a matrix shape.

The gate driver 120 is connected to the gate lines 20 to supply gate signals. For example, the gate driver 120 receives a gate control signal GDC including clock signals and a start signal from a level shifter. The gate driver 120 generates gate signals according to the clock signals and the start signal and provides them to the gate lines 20.

The level shifter shifts the voltage level of the clock signals and the start signal input from the timing controller 140 to the level of a gate-on voltage and the level of a gate-off voltage that can switch the transistors disposed in the sub-pixels P. The level shifter supplies the level shifted clock signals to the gate driver 120 through the clock signal lines and supplies the level shifted start signal to the gate driver 120 through the start signal line. Although the level shifter is described as a separate element from the gate driver 120, it may also be integrated with the gate driver 120.

The data driver 130 is connected to the data lines 30. The data driver 130 receives digital image data DATA and a data control signal DDC from the timing controller 140. The data driver 130 converts the digital image data DATA into analog data voltages according to the data control signal DDC. The data driver 130 supplies the analog data voltages to the data lines 30.

The timing controller 140 may receive the digital image data and timing signals from an external system board. The timing signals may include a vertical synchronization signal, a horizontal synchronization signal, and a data enable signal.

The timing controller 140 generates a gate control signal GDC for controlling the operation timing of the gate driver 120 and a data control signal DDC for controlling the operation timing of the data driver 130 based on the timing signals.

The gate control signal GDC may include, but is not limited to, a gate start signal, a gate clock signal, etc. The gate start signal is applied to a stage that generates a first output to activate the operation of the stage. The gate clock signal is a clock signal commonly input to the stages, to shift the gate start signal.

The data driver 130, the level shifter and the timing controller 140 may be formed as a single driving integrated circuit (IC). Further, the single driving IC may be disposed on the display panel 110. It is, however, to be understood that the present disclosure is not limited thereto. Each of the data driver 130, the level shifter and the timing controller 140 may be formed as a separate driving IC.

Figure 2:
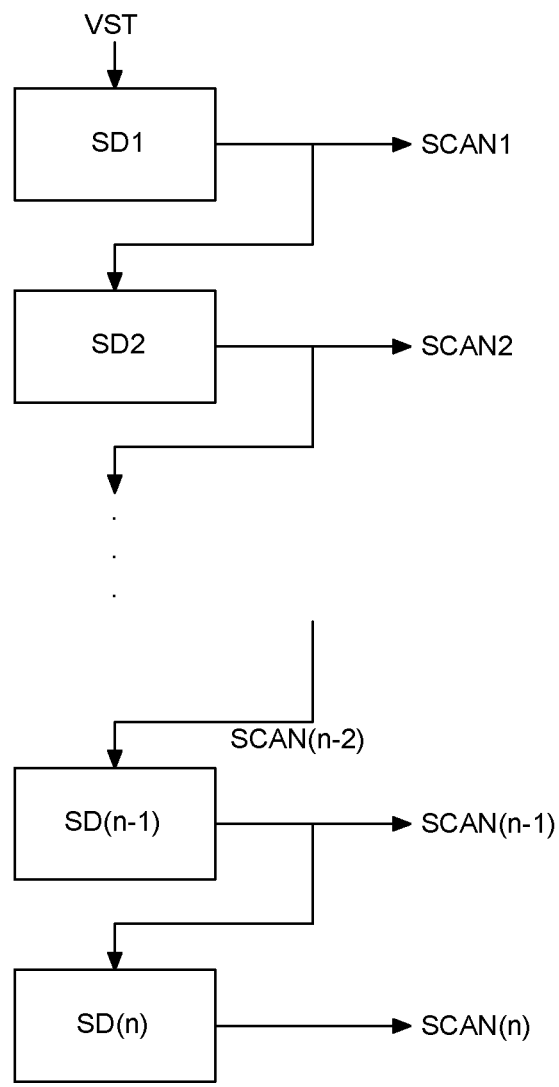
FIG. 2 is a block diagram showing an example of cascaded stages of the gate driver.

FIG. 2 is a block diagram showing an example of cascaded stages of the gate driver.

The gate driver may provide one or more scan signals (or gate signals) to a pixel circuit. The gate driver for generating one of the scan signals input to a pixel circuit will be described.

The gate driver includes a first stage SD1 to an $n^{th}$ stage SD(n) which are cascaded. The first stage SD1 generates a first scan signal SCAN1 and applies the first scan signal SCAN1 to the scan line of the first pixel line HL1. The second stage SD2 generates a second scan signal SCAN2 and applies the second scan signal SCAN2 to the scan line of the second pixel line HL2. The n$^{th}$ stage SD(n) generates the n$^{th}$ scan signal SCAN(n) and applies the n$^{th}$ scan signal SCAN(n) to the scan line of the n$^{th}$ pixel line HL(n).

The first stage SD1 is operated by receiving a start signal VST. Each of the second stage SD2 to the nth stage SD(n) is operated by receiving an output signal from the previous stage.

In this case, the first to n$^{th}$ scan signals may be referred to as first to n$^{th}$ gate signals, respectively, and the scan line may be referred to as a gate line.

Hereinafter, the circuitry of each of the stages will be described. In the following description, each of the stages includes a plurality of transistors, and each of the plurality of transistors is a p-type transistor.

Figure 3:
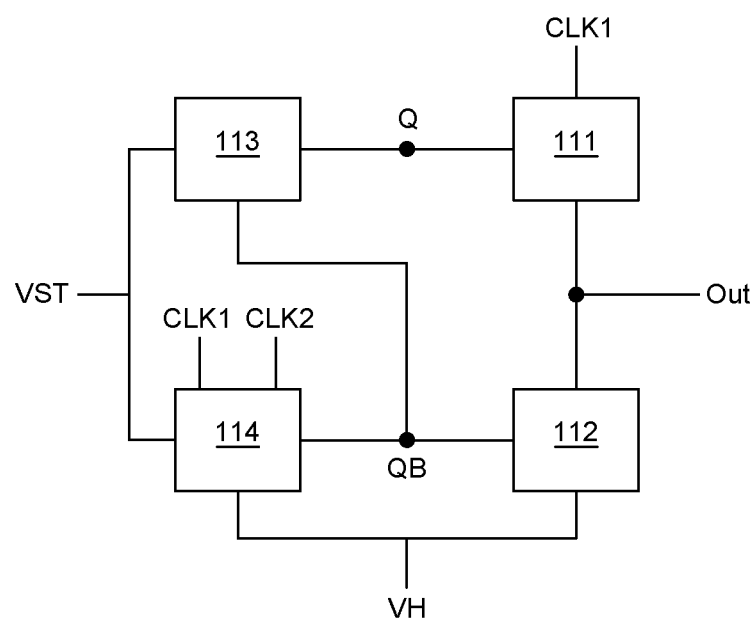
FIG. 3 is a block diagram of a gate driver according to an embodiment of the present disclosure.

FIG. 3 is a block diagram of a gate driver according to an embodiment of the present disclosure. Specifically, FIG. 3 is a block diagram showing a circuit forming each of the first stage SD1 to the n$^{th}$ stage SD(n) shown in FIG. 2.

Each of the stages includes a pull-up part 111, a pull-down part 112, a Q-node control unit 113, and a QB-node control unit 114.

The pull-up network 111 outputs the turn-on voltage as an output signal Out by the voltage applied to the Q-node Q. In this case, the turn-on voltage is the gate-low voltage of the first clock signal CLK1.

The pull-down network 112 outputs the turn-off voltage as an output signal Out by the voltage applied to the QB-node QB. In this case, the turn-off voltage is the gate-high voltage VH.

The Q-node control unit 113 applies the gate-low voltage VL of the start signal VST to the Q-node Q by the start signal VST when the output signal Out is the turn-on voltage. In addition, when the output signal Out is the turn-off voltage, the gate-high voltage VH is applied to the Q-node Q by the QB-node QB.

When the output signal Out is the turn-off voltage, the QB-node control unit 114 applies the gate-low voltage VL of the second clock signal CLK2 to the QB-node QB by the second clock signal CLK2. In this case, a capacitor may be used to apply a complete gate-low voltage VL to the QB-node QB. When the output signal Out is the turn-on voltage, the QB-node control unit 114 applies the gate-high voltage VH to the QB-node QB by the first clock signal CLK1 and the second clock signal CLK2 or the start signal VST.

The first clock signal CLK1 and the second clock signal CLK2 are in reverse-phase. For reliability of operation, the first clock signal CLK1 and the second clock signal CLK2 may have different widths of the turn-on voltage level period and the turn-off voltage level period so that the voltage levels are not simultaneously inverted.

Figure 4A:
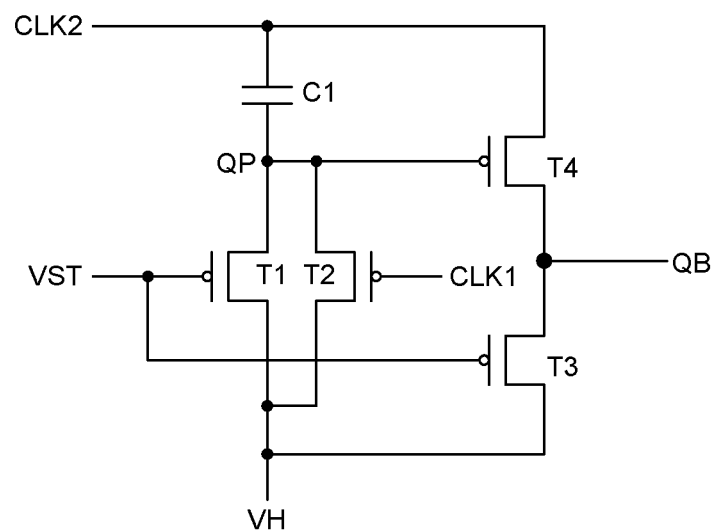
FIG. 4A is a circuit diagram showing a portion of a gate driver for applying a voltage to a QB-node according to an embodiment of the present disclosure.
Figure 4B:
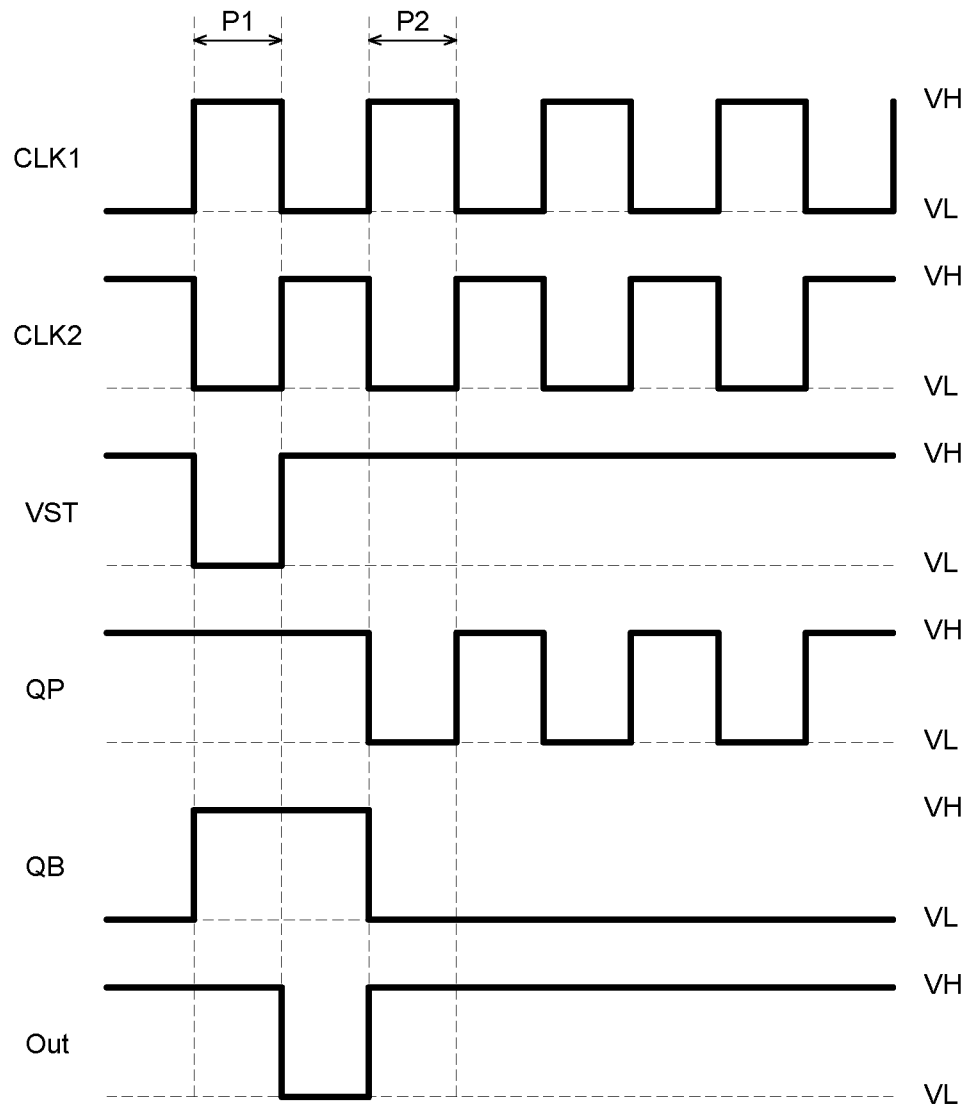
FIG. 4B is a waveform diagram of signals input to and output from the circuit of FIG. 4A.

FIG. 4A is a circuit diagram showing a portion of a gate driver for applying a voltage to a QB-node according to an embodiment of the present disclosure. Specifically, FIG. 4A shows a portion of the circuitry of each of the first stage SD1 to the n$^{th}$ stage SD(n) shown in FIG. 2. FIG. 4B is a waveform diagram of signals input to and output from the circuit of FIG. 4A.

Each stage includes a pull-up transistor, a pull-down transistor, a Q-node for controlling the pull-up transistor, and a QB-node for controlling the pull-down transistor. FIG. 4A is a circuit diagram showing a QB-node control unit for applying a voltage to the QB-node QB.

The QB-node control unit includes a first transistor T1, a second transistor T2, a third transistor T3, a fourth transistor T4, and a first capacitor C1. The QB-node control unit may include a QP-node control unit including a first transistor T1 and a second transistor T2, each of which has a first electrode connected to the QP-node QP.

The gate electrode of the first transistor T1 is connected to an input terminal from which the start signal VST is input. The first electrode thereof is connected to the QP-node QP, and the second electrode thereof is connected to an input terminal from which the gate-high voltage VH is input.

The gate electrode of the second transistor T2 is connected to the first clock signal CLK1. The first electrode thereof is connected to the QP-node QP, and the second electrode thereof is connected to the input terminal from which the gate high voltage VH is input.

The gate electrode of the third transistor T3 is connected to an input terminal from which the start signal VST is input. The first electrode thereof is connected to the QB-node QB, and the second electrode thereof is connected to the input terminal from which the gate-high voltage VH is input.

The gate electrode of the fourth transistor T4 is connected to the QP-node QP. The first electrode thereof is connected to an input terminal from which the second clock signal CLK2 is input, and the second electrode thereof is connected to the QB-node QB.

The first capacitor C1 is connected between the input terminal from which the second clock signal CLK2 is input and the QP-node QP.

In the first period P1, the gate-high voltage VH is applied to the QB-node QB. The second transistor T2 is turned off by the first clock signal CLK1 at the gate-high voltage VH. The first transistor T1 and the third transistor T3 are turned on by the start signal VST at the gate-low voltage VL. Accordingly, the gate-high voltage VH is applied to the QP-node QP through the first transistor T1, and the gate-high voltage VH is applied to the QB-node QB through the third transistor T3. Then, the fourth transistor T4 is turned off by the voltage applied to the QP-node QP. Therefore, the gate-high voltage VH is applied to the QB-node QB by the gate-low voltage VL of the start signal VST. In this case, the first period P1 may be referred to as a reset period of the QB-node QB.

In the second period P2, the gate-low voltage VL is applied to the QB-node QB. The first transistor T1 and the third transistor T3 are turned off by the start signal VST at the gate-high voltage VH, and the second transistor T2 is turned off by the first clock signal CLK1 at the gate-high voltage VH. Accordingly, the QP-node QP is floating. As the second clock signal CLK2 applied to the first electrode of the first capacitor C1 decreases from the gate-high voltage VH to the gate-low voltage VL, the voltage at the QP-node QP connected to the second electrode of the first capacitor C1 decreases to the gate-low voltage VL by the coupling. Therefore, the gate-low voltage VL may be applied to the QB-node QB, such that the pull-down transistor may be turned on to provide the output signal Out to the gate line of the pixel line. In this case, the second period P2 may be referred to as a set period of the QB-node QB.

Figure 5A:
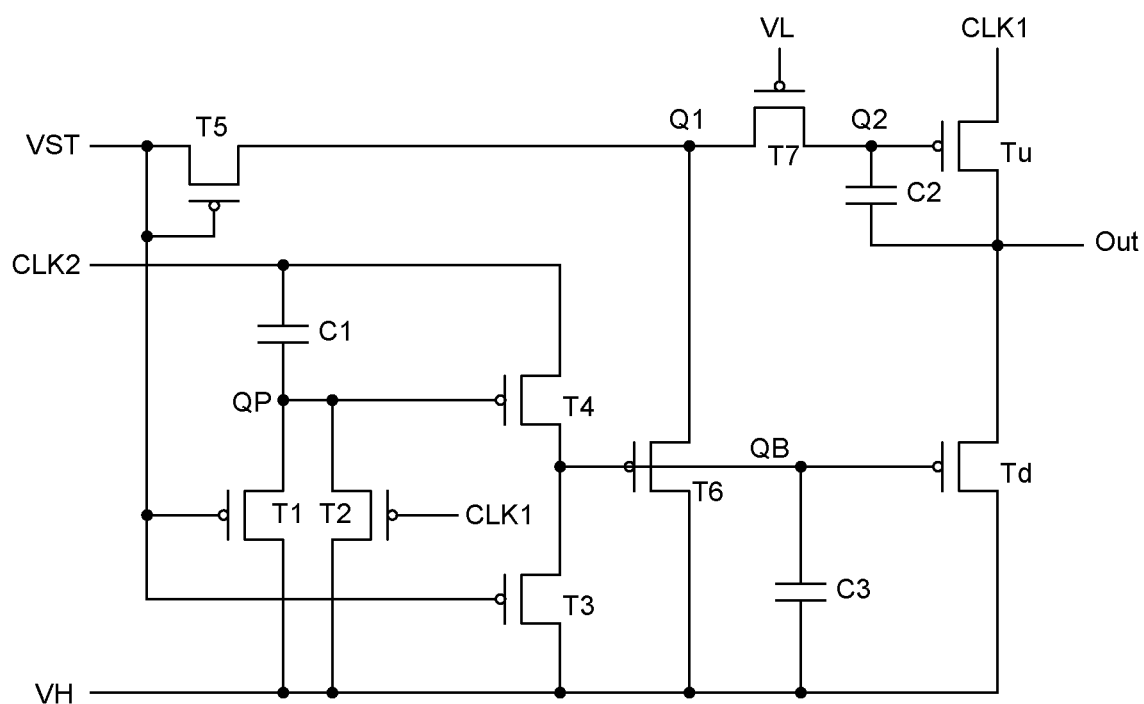
FIG. 5A is a circuit diagram illustrating a gate driver employing the circuit shown in FIG. 4A according to a first embodiment of the present disclosure.
Figure 5B:
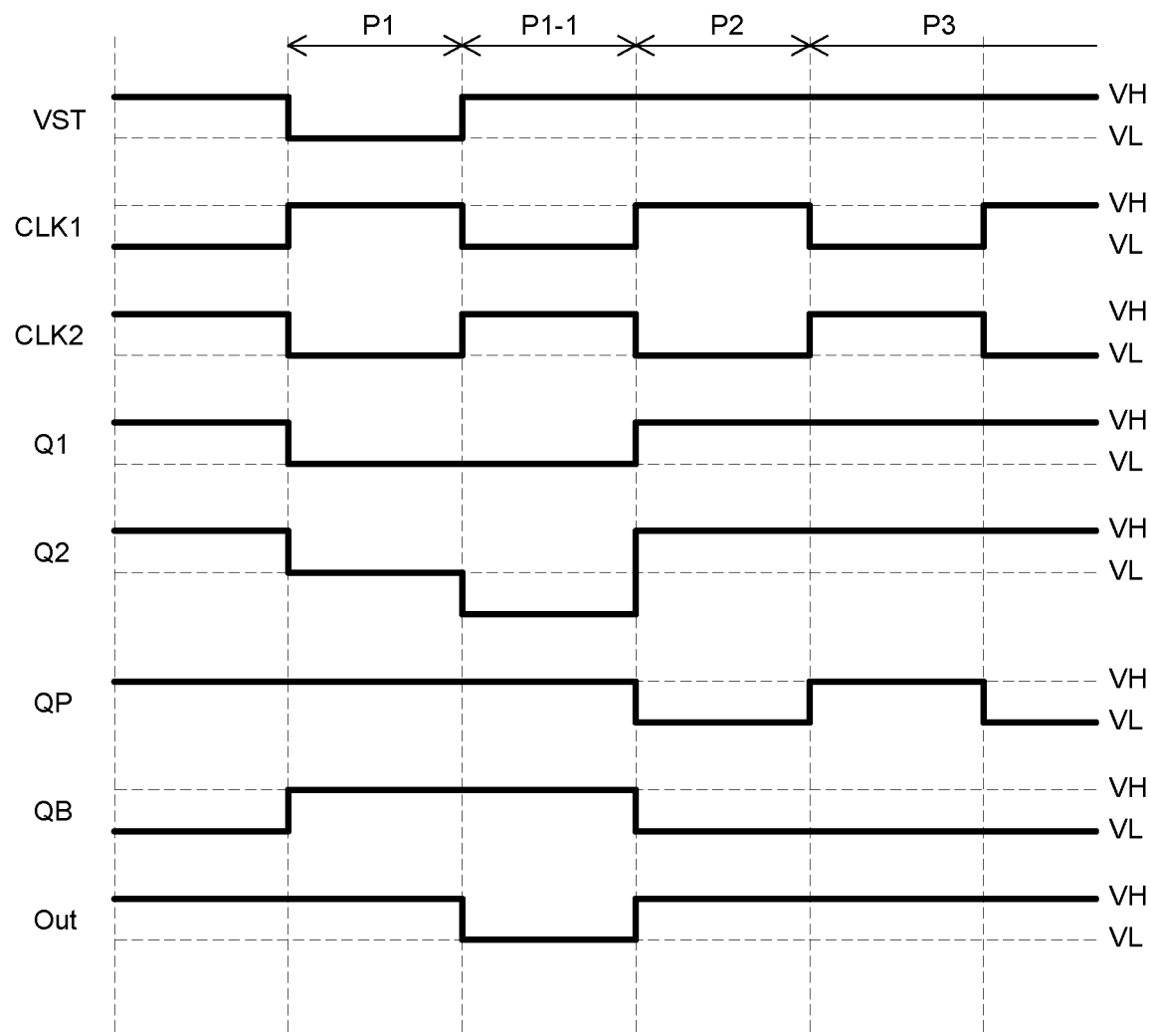
FIG. 5B is a waveform diagram of signals input to and output from the circuit of FIG. 5A.

FIG. 5A is a circuit diagram illustrating a gate driver employing the circuit shown in FIG. 4A according to a first embodiment of the present disclosure. Specifically, FIG. 5A shows the circuitry of each of the first stage SD1 to the n$^{th}$ stage SD (n) shown in FIG. 2. FIG. 5B is a waveform diagram of signals input to and output from the circuit of FIG. 5A.

Each of the stages includes a pull-up part, a pull-down part, a Q-node control unit, and a QB-node control unit.

The pull-up network outputs the turn-on voltage of the first clock signal CLK1 as the output signal Out via the Q-node. The pull-up network may include a pull-up transistor Tu and a second capacitor C2. The gate electrode of the pull-up transistor Tu is connected to the Q-node (or Q2-node). The first electrode thereof is connected to an input terminal from which the first clock signal CLK1 is input, and the second electrode thereof is connected to an output terminal via which the output signal Out is output. The first electrode of the second capacitor C2 is connected to the Q-node (or Q2-node), and the second electrode thereof is connected to the output terminal via which the output signal Out is output.

The pull-down network outputs the gate-high voltage VH as the output signal Out via the QB-node QB. The pull-down network includes a pull-down transistor Td.

In the first period P1, the Q-node control unit applies the gate-low voltage VL to the Q-node (or Q1-node). The Q-node control unit applies the turn-on voltage of the start signal VST to the Q-node (or Q1-node) by the start signal VST in the first period P1. Then, the Q-node control unit applies the gate-high voltage VH to the Q-node (or Q1-node) in the second period P2. The Q-node control unit includes a fifth transistor T5 and a sixth transistor T6.

The Q-node control unit may further include a Q1-node stabilization unit. The Q1-node stabilization unit includes a seventh transistor T7. The Q-node is divided into the Q1-node Q1 and the Q2-node Q2 by the Q1-node stabilization unit, and the seventh transistor T7 is connected between the Q1-node Q1 and the Q2-node Q2. The gate-low voltage VL is applied to the gate electrode of the seventh transistor T7. The Q1-node stabilization unit can suppress the voltage at the Q1-node Q1 from suddenly changing while the Q2-node Q2 is bootstrapped by the second capacitor C2, to thereby avoid the voltage difference between the drain electrode and the source electrode of the fifth transistor T5 and the sixth transistor T6 from instantaneously increasing. The electrical stress applied to the fifth transistor T5 and the sixth transistor T6 can be reduced by the Q1-node stabilization unit.

The gate electrode and the first electrode of the fifth transistor T5 are connected to the input terminal from which the start signal VST is input, and the second electrode thereof is connected to the Q1-node Q1.

The gate electrode of the sixth transistor T6 is connected to the QB-node QB. The first electrode thereof is connected to the Q1-node Q1, and the second electrode thereof is connected to the input terminal from which the gate-high voltage VH is input.

In the first period P1, the gate-low voltage VL is applied to the Q1-node Q1 and the Q2-node Q2. The fifth transistor T5 is turned on by the start signal VST at the gate-low voltage VL, such that the gate-low voltage VL is applied to the Q1-node Q1 through the fifth transistor T5. Since the seventh transistor T7 is turned on all the time, the gate-low voltage VL is applied to the Q2-node Q2. The pull-up transistor Tu is turned on by the gate-low voltage VL applied to the Q2-node Q2. In this case, since the first clock signal CLK1 is at the level of the gate-high voltage VH, the output signal Out is the turn-off voltage.

In the $(1-1)^{th}$ period $P(1-1)$ subsequent to the first period P1, the output signal Out is the turn-on voltage. The Q1-node Q1 becomes floating in the gate-low voltage VL state by the start signal VST at the gate-high voltage VH. Since the first clock signal CLK1 is changed to the gate-low voltage VL, the gate-low voltage VL is applied to the output signal Out, and at the same time, the voltage at the Q2-node Q2 becomes lower than the gate-low voltage VL by the bootstrap of the second capacitor C2. The pull-up transistor Tu can stably output the output signal Out by the voltage at the Q2-node Q2 which has become lower than the gate-low voltage VL.

In the second period P2, the gate-high voltage VH is applied to the Q1-node Q1 and the Q2-node Q2. The sixth transistor T6 is turned on by the gate-low voltage VL applied to the QB-node QB, and the gate-high voltage VH is applied to the Q1-node Q1 through the sixth transistor T6. Thus, the pull-up transistor Tu is turned off.

Hereinafter, the operation of the QB-node control unit in the first period P1, the $(1-1)^{th}$ period $P(1-1)$ and the second period P2 will be described in detail.

The QB-node control unit applies the gate-low voltage VL to the QB-node QB by applying the turn-on voltage of the second clock signal CLK2 to the QP-node QP by the coupling of the first capacitor C1. Then, the gate-high voltage VH is applied to the QB-node QB by the start signal VST.

The QB-node control unit includes a first transistor T1, a second transistor T2, a third transistor T3, a fourth transistor T4, and a first capacitor C1.

The gate electrode of the first transistor T1 is connected to an input terminal from which the start signal VST is input. The first electrode thereof is connected to the QP-node QP, and the second electrode thereof is connected to an input terminal from which the gate-high voltage VH is input.

The gate electrode of the second transistor T2 is connected to the first clock signal CLK1. The first electrode thereof is connected to the QP-node QP, and the second electrode thereof is connected to the input terminal from which the gate-high voltage VH is input.

The gate electrode of the third transistor T3 is connected to the input terminal from which the start signal VST is input. The first electrode thereof is connected to the QB-node QB, and the second electrode thereof is connected to the input terminal from which the gate-high voltage VH is input.

The gate electrode of the fourth transistor T4 is connected to the QP-node QP. The first electrode thereof is connected to an input terminal from which the second clock signal CLK2 is input, and the second electrode thereof is connected to the QB-node QB.

The first electrode of the first capacitor C1 is connected to the input terminal from which the second clock signal CLK2 is input, and the second electrode thereof is connected to the QP-node QP.

In the first period P1, the gate-high voltage VH is applied to the QB-node QB. The second transistor T2 is turned off by the first clock signal CLK1 at the gate-high voltage VH. The first transistor T1 and the third transistor T3 are turned on by the start signal VST at the gate-low voltage VL. Accordingly, the gate-high voltage VH is applied to the QP-node QP through the first transistor T1, and the gate-high voltage VH is applied to the QB-node QB through the third transistor T3. Then, the fourth transistor T4 is turned off by the voltage applied to the QP-node QP. Therefore, the gate-high voltage VH is applied to the QB-node QB by the gate-low voltage VL of the start signal VST. In this case, the first period P1 may be referred to as a reset period of the QB-node QB. The gate-high voltage VH applied to the QB-node QB is held even during the $(1-1)^{th}$ period $P(1-1)$.

In the second period P2, the gate-low voltage VL is applied to the QB-node QB. The first transistor T1 and the third transistor T3 are turned off by the start signal VST at the gate-high voltage VH, and the second transistor T2 is turned off by the first clock signal CLK1 at the gate-high voltage VH. Accordingly, the QP node QP is floating. As the second clock signal CLK2 applied to the first electrode of the first capacitor C1 decreases from the gate-high voltage VH to the gate-low voltage VL, the voltage at the QP-node QP connected to the second electrode of the first capacitor C1 decreases to the gate-low voltage VL by the coupling. Therefore, the fourth transistor T4 is turned on by the voltage at the QP-node QP, such that the gate-low voltage VL can be fully applied to the QB-node QB. As the gate-low voltage VL can be fully applied to the QB-node QB, the pull-down transistor Td is turned on so that the output signal Out of the gate-high voltage VH can be applied to the gate line of the pixel line. In this case, the second period P2 may be referred to as the set period of the QB-node QB.

A third period P3 is a period of time after the second period P2 until the next frame. The pull-down transistor Td remains turned on so as to keep the output signal Out at the gate-high voltage VH. In this case, the QB-node control unit may further include the third capacitor C3. The first electrode of the third capacitor C3 is connected to the QB-node QB, and the second electrode thereof is connected to the input terminal from which the gate-high voltage VH is input. The third capacitor C3 can hold the voltage charged between its first electrode and second electrode in the second period P2 during the third period P3, so that the voltage at the QB-node QB is held at the gate-low voltage VL. The voltage at the QP-node QP is coupled by the second clock signal CLK2 periodically changed to the gate-low voltage VL during the third period P3, decreasing to the gate-low voltage VL. Accordingly, the fourth transistor T4 is turned on by the gate-low voltage VL, such that the gate-low voltage VL is applied to the QB-node QB. In this case, the third period P3 may be referred to as a holding period of the QB-node QB.

Accordingly, the QB-node control unit further includes the third capacitor C3 connected between the QB-node QB and the input terminal from which the gate-high voltage VH is input, so that the voltage charged between the first electrode and the second electrode during the set period can be held during the holding period.

In addition, since the QP-node QP is coupled to the second clock signal CLK2 by the first capacitor C1, such that the gate-low voltage VL is periodically applied to the QP-node QP. Accordingly, the gate-low voltage VL can be periodically applied to the QP-node QP during the holding period.

Figure 6A:
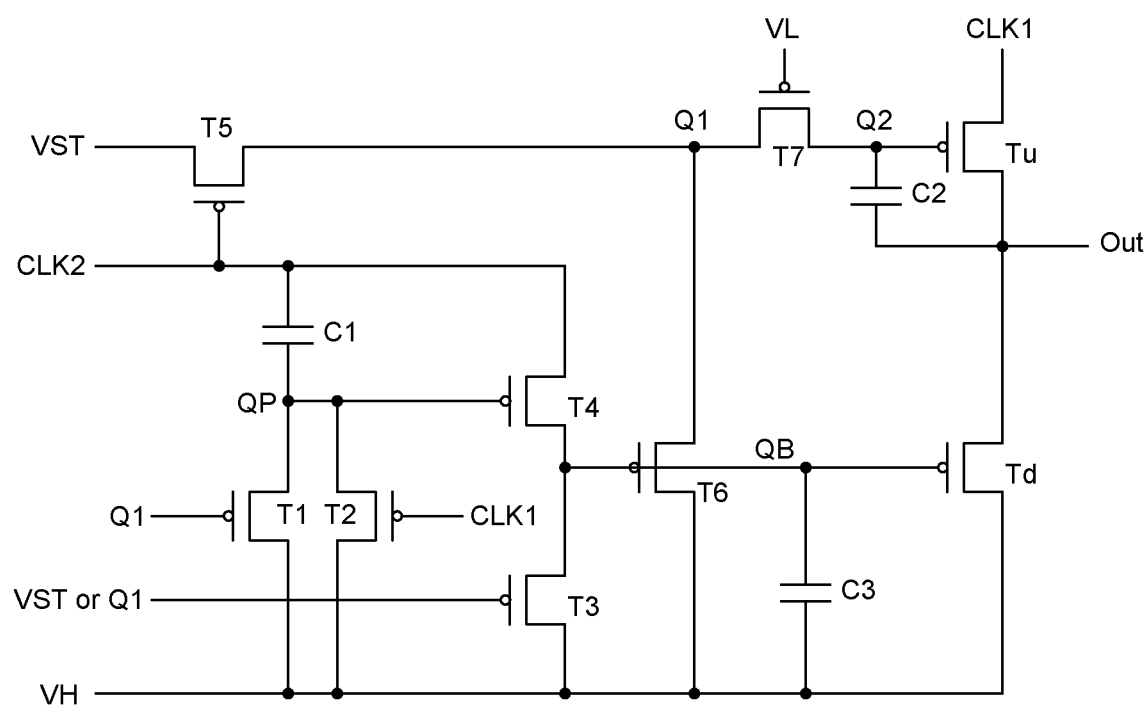
FIG. 6A is a circuit diagram illustrating a gate driver employing the circuit shown in FIG. 4A according to a second embodiment of the present disclosure.
Figure 6B:
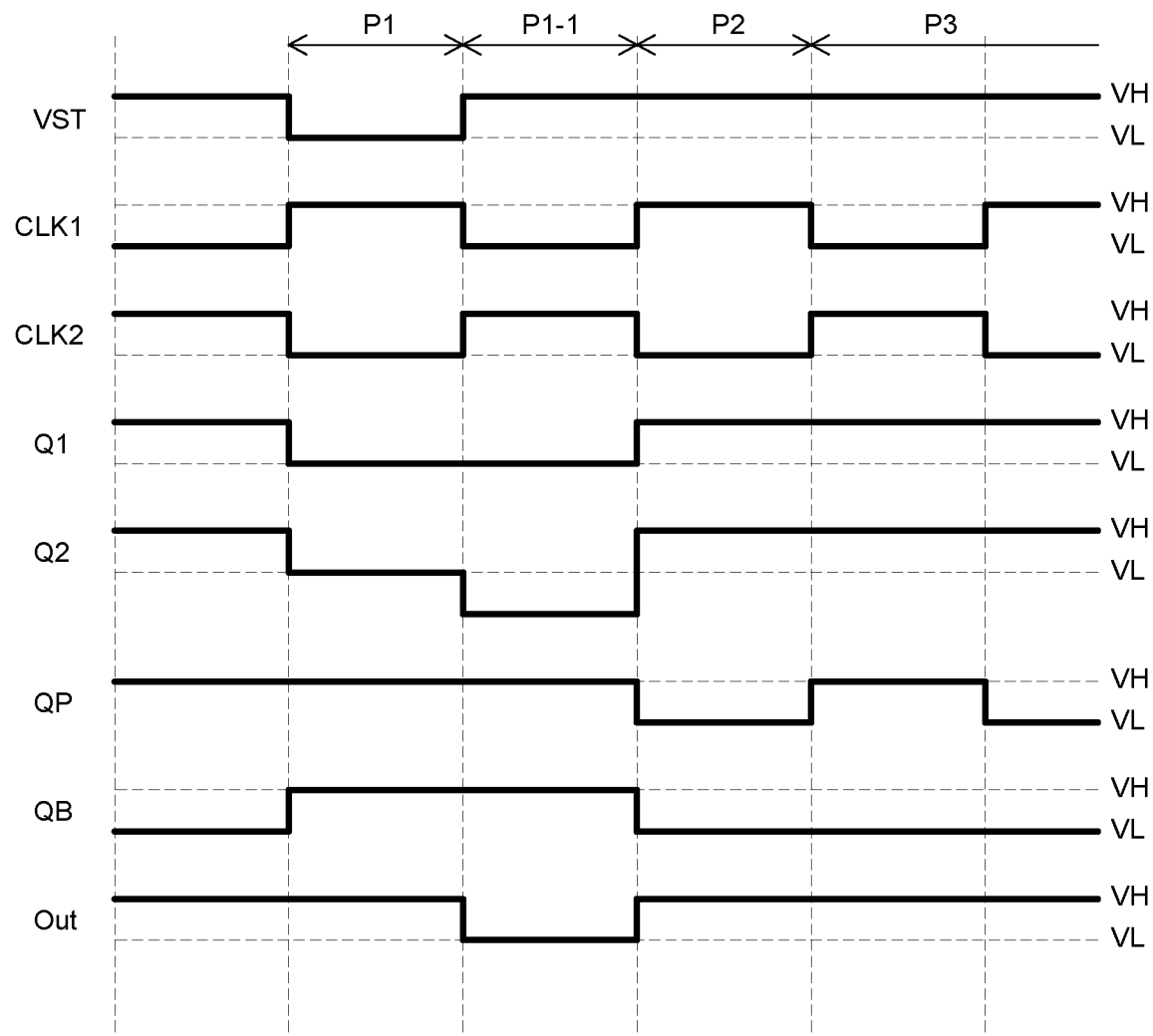
FIG. 6B is a waveform diagram of signals input to and output from the circuit of FIG. 6A.

FIG. 6A is a circuit diagram illustrating a gate driver employing the circuit shown in FIG. 4A according to a second embodiment of the present disclosure. FIG. 6B is a waveform diagram of signals input to and output from the circuit of FIG. 6A. FIG. 6A shows a modification of the example shown in FIG. 5A; and, therefore, the redundant description will be omitted.

Each of the stages includes a pull-up part, a pull-down part, a Q-node control unit, and a QB-node control unit. The pull-up network and pull-down network of FIG. 6A are identical to the counterparts of FIG. 5A, while the Q-node control unit and the QB-node control unit of FIG. 6A are modified from the Q-node control unit and the QB-node control unit of FIG. 5A, respectively. As mentioned above with reference to FIG. 5A, the Q-node control unit may further include a Q1-node stabilization unit, but it may be omitted. In the following description, as shown in FIG. 6A, the circuit includes the Q1-node stabilization unit. Therefore, the Q-node control unit will be referred to as a Q2-node control unit.

Referring to FIGS. 6A and 6B, the Q2-node control unit applies the gate-low voltage VL to the Q1-node Q1 in the first period P1. The Q2-node control unit applies the turn-on voltage of the start signal VST to the Q1-node by the start signal VST in the first period P1. Then, the Q2-node control unit applies the gate-high voltage VH to the Q1-node in the second period P2. The Q2-node control unit includes a fifth transistor T5, a sixth transistor T6 and a seventh transistor T7.

The gate electrode of the fifth transistor T5 is connected to the input terminal from which the second clock signal CLK2 is input. The first electrode thereof is connected to the input terminal from which the start signal VST is input, and the second electrode thereof is connected to the Q1-node Q1.

The gate electrode of the sixth transistor T6 is connected to the QB-node QB. The first electrode thereof is connected to the Q1-node Q1, and the second electrode thereof is connected to the input terminal from which the gate-high voltage VH is input.

The gate electrode of the seventh transistor T7 is connected to the input terminal from which the gate-low voltage VL is input. The first electrode thereof is connected to the Q1-node Q1, and the second electrode thereof is connected to the Q2-node Q2.

In the first period P1, the gate-low voltage VL is applied to the Q1-node Q1 and the Q2-node Q2. The fifth transistor T5 is turned on by the second clock signal CLK2 at the gate-low voltage VL, such that the gate-low voltage VL of the start signal VST is applied to the Q1-node Q1 through the fifth transistor T5. Since the seventh transistor T7 is turned on all the time, the gate-low voltage VL is applied to the Q2-node Q2. The pull-up transistor Tu is turned on by the gate-low voltage VL applied to the Q2-node Q2. In this case, since the first clock signal CLK1 is at the level of the gate-high voltage VH, the output signal Out is the turn-off voltage.

In the $(1\text{-}1)^{th}$ period P(1-1) subsequent to the first period P1, the output signal Out is the turn-on voltage. The Q1-node Q1 becomes floating in the gate-low voltage VL state by the second clock signal CLK2 at the gate-high voltage VH. Since the first clock signal CLK1 is changed to the gate-low voltage VL, the gate-low voltage VL is applied to the output signal Out, and at the same time, the voltage at the Q2-node Q2 becomes lower than the gate-low voltage VL by the bootstrap of the second capacitor C2. The pull-up transistor Tu can stably output the output signal Out by the voltage at the Q2-node Q2 which has become lower than the gate-low voltage VL.

In the second period P2, the gate-high voltage VH is applied to the Q1-node Q1 and the Q2-node Q2. The sixth transistor T6 is turned on by the gate-low voltage VL applied to the QB-node QB, and the gate-high voltage VH is applied to the Q1-node Q1 through the sixth transistor T6. In addition, the fifth transistor T5 is turned on by the second clock signal CLK2 changed to the gate-low voltage VL, such that the gate-high voltage VH of the start signal VST is applied to the Q1-node Q1. Thus, the pull-up transistor Tu is turned off.

The QB-node control unit applies the gate-low voltage VL to the QB-node QB by applying the turn-on voltage of the second clock signal CLK2 to the QP-node QP by the coupling of the first capacitor C1. Then, the QB-node control unit applies the gate-high voltage VH to the QB-node QB by the start signal VST or the Q1-node Q1.

The QB-node control unit includes a first transistor T1, a second transistor T2, a third transistor T3, a fourth transistor T4, and a first capacitor C1.

The gate electrode of the first transistor T1 is connected to the Q1-node Q1. The first electrode thereof is connected to the QP-node QP, and the second electrode thereof is connected to the input terminal from which the gate-high voltage VH is input.

The gate electrode of the second transistor T2 is connected to the first clock signal CLK1. The first electrode thereof is connected to the QP-node QP, and the second electrode thereof is connected to the input terminal from which the gate-high voltage VH is input.

The gate electrode of the third transistor T3 is connected to the input terminal from which the start signal VST is input or the Q1-node. The first electrode thereof is connected to the QB-node QB, and the second electrode thereof is connected to the input terminal from which the gate-high voltage VH is input.

The gate electrode of the fourth transistor T4 is connected to the QP-node QP. The first electrode thereof is connected to an input terminal from which the second clock signal CLK2 is input, and the second electrode thereof is connected to the QB-node QB.

The first electrode of the first capacitor C1 is connected to the input terminal from which the second clock signal CLK2 is input, and the second electrode thereof is connected to the QP-node QP.

In the first period P1, the gate-high voltage VH is applied to the QB-node QB. The second transistor T2 is turned off by the first clock signal CLK1 at the gate-high voltage VH. The first transistor T1 and the third transistor T3 are turned on by the start signal VST or the Q1-node Q1 at the gate-low voltage VL. Accordingly, the gate-high voltage VH is applied to the QP-node QP through the first transistor T1, and the gate-high voltage VH is applied to the QB-node QB through the third transistor T3. Then, the fourth transistor T4 is turned off by the voltage applied to the QP-node QP. Therefore, the gate-high voltage VH is applied to the QB-node QB by the gate-low voltage VL of the start signal VST. The gate-high voltage VH applied to the QB-node QB is held even during the (1-1)th period P(1-1).

In the second period P2, the gate-low voltage VL is applied to the QB-node QB. The first transistor T1 is turned off by the Q1 node Q1 at the gate-high voltage VH. The third transistor T3 is turned off by the Q1-node Q1 or the start signal VST at the gate-high voltage VH, and the second transistor T2 is turned off by the first clock signal CLK1 at the gate-high voltage VH. Accordingly, the QP-node QP is floating. As the second clock signal CLK2 applied to the first electrode of the first capacitor C1 decreases from the gate-high voltage VH to the gate-low voltage VL, the voltage at the QP-node QP connected to the second electrode of the first capacitor C1 decreases to the gate-low voltage VL by the coupling. Therefore, the fourth transistor T4 is turned on by the voltage at the QP-node QP, such that the gate-low voltage VL can be fully applied to the QB-node QB. Then, the pull-down transistor Td is turned on so that the output signal Out of the gate-high voltage VH can be provided to the gate line of the pixel line.

As described above with respect to the first embodiment, the third period P3 is a period of time after the second period P2 until the next frame. The pull-down transistor Td remains turned on so as to keep the output signal Out at the gate-high voltage VH. In this case, the QB-node control unit may further include the third capacitor C3. The third capacitor C3 holds the voltage charged between its first electrode and second electrode in the second period P2 during the third period P3. The voltage at the QP-node QP is coupled by the second clock signal CLK2 periodically changed to the gate-low voltage VL during the third period P3, decreasing to the gate-low voltage VL. Accordingly, the fourth transistor T4 is turned on by the gate-low voltage VL, such that the gate-low voltage VL is applied to the QB-node QB.

Figure 7A:
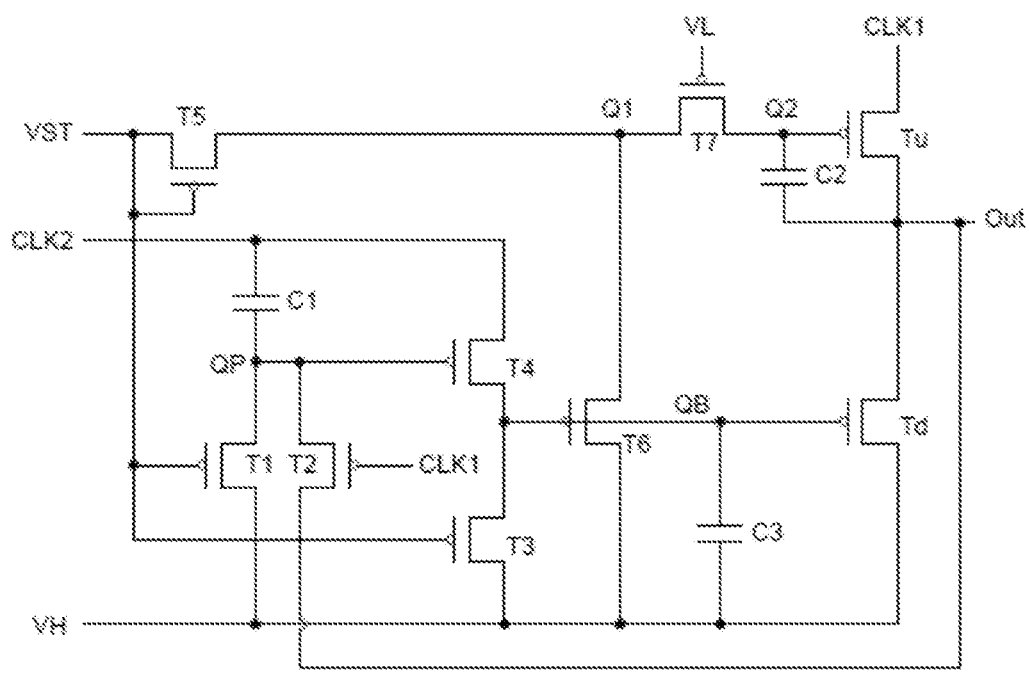
FIG. 7A is a circuit diagram illustrating a gate driver employing the circuit shown in FIG. 4A according to a third embodiment of the present disclosure.
Figure 7B:
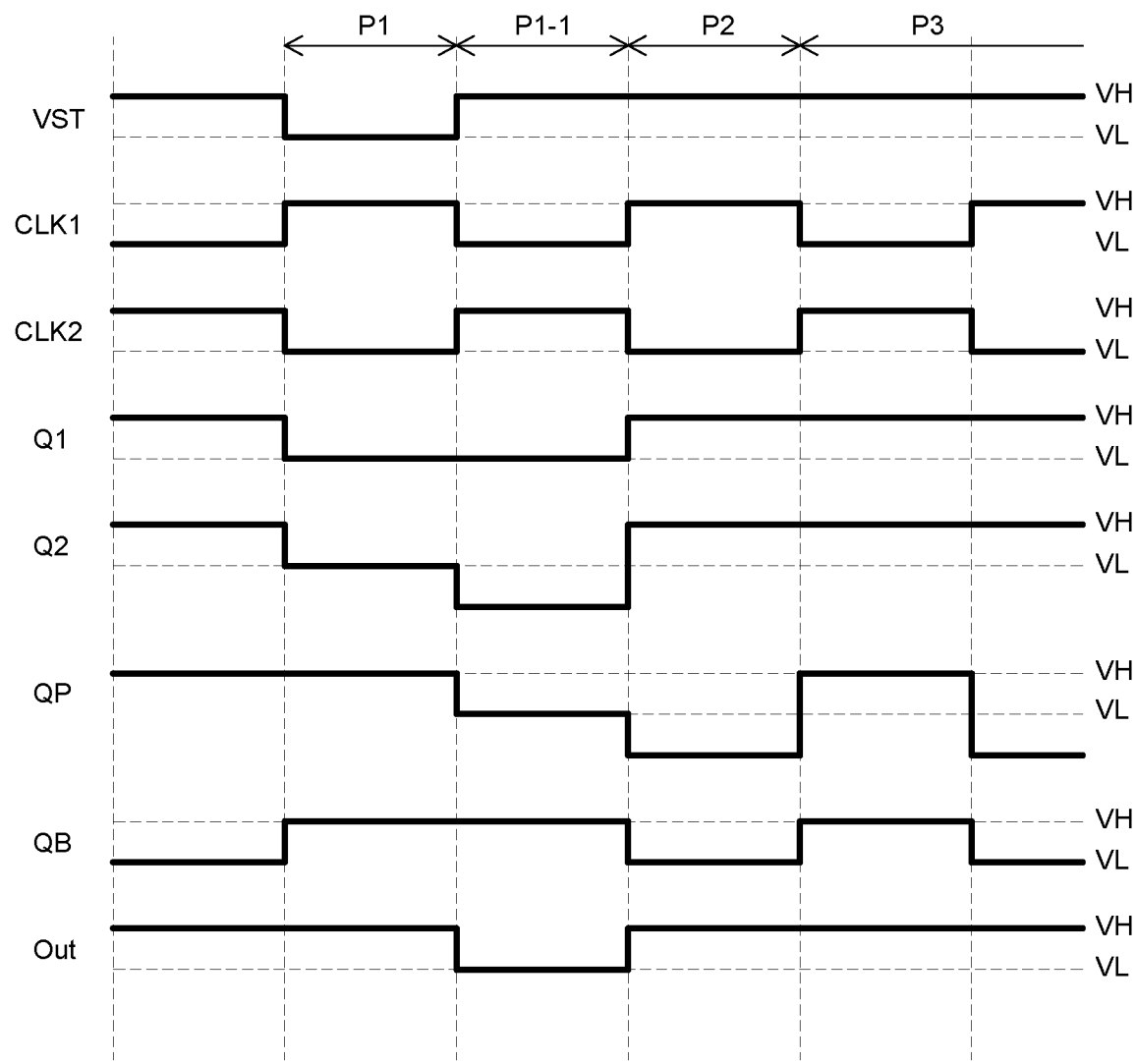
FIG. 7B is a waveform diagram of signals input to and output from the circuit of FIG. 7A.

FIG. 7A is a circuit diagram illustrating a gate driver employing the circuit shown in FIG. 4A according to a third embodiment of the present disclosure. FIG. 7B is a waveform diagram of signals input to and output from the circuit of FIG. 7A. FIG. 7A shows a modification of the example shown in FIG. 5A; and, therefore, the redundant description will be omitted.

Each of the stages includes a pull-up part, a pull-down part, a Q-node control unit, and a QB-node control unit. The pull-up network, the pull-down network and the Q-node control unit of FIG. 7A are identical to the counterparts of FIG. 5A, while the QB-node control unit of FIG. 7A is modified from the QB-node control unit of FIG. 5A. As mentioned above with reference to FIG. 5A, the Q-node control unit may further include a Q1-node stabilization unit, but it may be omitted. In the following description, as shown in FIG. 7A, the circuit includes the Q1-node stabilization unit. Therefore, the Q-node control unit will be referred to as a Q2-node control unit. The Q2-node control unit is identical to that of FIG. 5A; and, therefore, the redundant description will be omitted.

Referring to FIGS. 7A and 7B, the QB-node control unit applies the gate-low voltage VL to the QB-node QB by applying the turn-on voltage of the second clock signal CLK2 to the QP-node QP by the coupling of the first capacitor C1. Then, the QB-node control unit applies the gate-high voltage VH to the QB-node QB by the start signal VST.

The QB-node control unit includes a first transistor T1, a second transistor T2, a third transistor T3, a fourth transistor T4, and a first capacitor C1.

The gate electrode of the first transistor T1 is connected to an input terminal from which the start signal VST is input. The first electrode thereof is connected to the QP-node QP, and the second electrode thereof is connected to an input terminal from which the gate-high voltage VH is input.

The gate electrode of the second transistor T2 is connected to the first clock signal CLK1. The first electrode thereof is connected to the QP-node QP, and the second electrode thereof is connected to the output terminal via which the output signal Out is output.

The gate electrode of the third transistor T3 is connected to the input terminal from which the start signal VST is input. The first electrode thereof is connected to the QB-node QB, and the second electrode thereof is connected to the input terminal from which the gate-high voltage VH is input.

The gate electrode of the fourth transistor T4 is connected to the QP-node QP. The first electrode thereof is connected to an input terminal from which the second clock signal CLK2 is input, and the second electrode thereof is connected to the QB-node QB.

The first electrode of the first capacitor C1 is connected to the input terminal from which the second clock signal CLK2 is input, and the second electrode thereof is connected to the QP-node QP.

In the first period P1, the gate-high voltage VH is applied to the QB-node QB. The second transistor T2 is turned off by the first clock signal CLK1 at the gate-high voltage VH. The first transistor T1 and the third transistor T3 are turned on by the start signal VST at the gate-low voltage VL. Accordingly, the gate-high voltage VH is applied to the QP-node QP through the first transistor T1, and the gate-high voltage VH is applied to the QB-node QB through the third transistor T3. Then, the fourth transistor T4 is turned off by the voltage applied to the QP-node QP. Therefore, the gate-high voltage VH is applied to the QB-node QB by the gate-low voltage VL of the start signal VST.

The gate-high voltage VH applied to the QB-node QB is held even during the $(1\text{-}1)^{th}$ period P(1-1). The output signal Out is the gate-low voltage VL. During the $(1\text{-}1)^{th}$ period P(1-1), the first transistor T1 and the third transistor T3 are turned off by the start signal VST at the gate-high voltage VH, and the second transistor T2 is turned on by the first clock signal CLK1 at the gate-low voltage VL. Accordingly, the output signal Out is applied to the QP-node QP. As the gate-low voltage VL is applied to the QP-node QP, the fourth transistor T4 is turned on such that the second clock signal CLK2 at the gate-high voltage VH is applied to the QB-node QB. In the $(1\text{-}1)^{th}$ period P(1-1), the QP node QP becomes the gate-low voltage VL by the output signal Out input through the second transistor T2, such that the QB-node QB may not be floating but may hold the gate-high voltage VH.

In the second period P2, the gate-low voltage VL is applied to the QB-node QB. The first transistor T1 is turned off by the start signal VST at the gate-high voltage VH. The third transistor T3 is turned off by the start signal VST at the gate-high voltage VH, and the second transistor T2 is turned off by the first clock signal CLK1 at the gate-high voltage VH. Accordingly, the QP-node QP is floating. As the second clock signal CLK2 applied to the first electrode of the first capacitor C1 decreases from the gate-high voltage VH to the gate-low voltage VL, the voltage at the QP-node QP connected to the second electrode of the first capacitor C1 decreases to be a voltage lower than the gate-low voltage VL by the coupling. Therefore, the fourth transistor T4 is turned on by the voltage at the QP-node QP, such that the gate-low voltage VL can be fully applied to the QB-node QB. Then, the pull-down transistor Td is turned on so that the output signal Out of the gate-high voltage VH can be provided to the gate line of the pixel line.

As described above with respect to the first embodiment, the third period P3 is a period of time after the second period P2 until the next frame. The pull-down transistor Td remains turned on so as to keep the output signal Out at the gate-high voltage VH. In this case, the QB-node control unit may further include the third capacitor C3. The third capacitor C3 holds the voltage charged between its first electrode and second electrode in the second period P2. The voltage at the QP-node QP is coupled by the second clock signal CLK2 periodically changed to the gate-low voltage VL during the third period P3, decreasing to a voltage lower than the gate-low voltage VL. Accordingly, the fourth transistor T4 is turned on by the gate-low voltage VL, such that the gate-low voltage VL is applied to the QB-node QB.

The embodiments of the present disclosure can also be described as follows:

According to an aspect of the present disclosure, a gate driver and a display panel including the same may be described as follows:

The display panel comprises pixels connected to gate lines, and a gate driver that supplies a gate signal to at least one of the gate lines and includes a plurality of stages. Each stage includes a pull-up transistor to apply a turn-on voltage of a first clock signal to an output terminal responsive to a voltage at a Q-node, a pull-down transistor to apply a turn-off voltage to the output terminal responsive to a voltage at a QB-node that holds the turn-on voltage during a period in which the output terminal is applied the turn-off voltage, and a QB-node control unit to apply the turn-on voltage to the QB-node responsive to the first clock signal and a second clock signal in reverse-phase with the first clock signal. Accordingly, a display panel may include a gate driver that can set, reset and hold the voltage at a QB-node by a QB-node control unit.

Each stage may further include a Q-node control unit to apply the turn-on voltage to the Q-node responsive to a start signal or the second clock signal.

The Q-node may include a Q1-node and a Q2-node, and the Q-node control unit may further include a Q-node stabilization unit connected between the Q1-node and the Q2-node.

The Q-node control unit may apply a gate-high voltage to the Q-node responsive to the voltage at the QB-node.

The turn-on voltage may be a gate-low voltage, and the turn-off voltage may be a gate-high voltage.

Each stage may further include a capacitor connected between the QB-node and an input terminal of the gate-high voltage.

The QB-node control unit may include a first capacitor having a first electrode being applied the second clock signal, and a second electrode connected to a QP-node coupled with the second clock signal.

The QB-node control unit may further include a QP-node control unit for controlling the QP-node.

The QP-node control unit may include a first transistor and a second transistor each having an electrode connected to the QP-node.

According to another aspect of the present disclosure, a gate driver comprises a QB-node control unit to control a QB-node, the QB-node being a gate node of a pull-down transistor. The QB-node control unit comprises a first transistor and a second transistor each having an electrode connected to a QP-node for controlling the QP-node, a third transistor to apply a gate-high voltage to the QB-node, and a fourth transistor having a gate electrode connected to the QP-node to apply a gate-low voltage to the QB-node. The gate driver with improved accuracy of an output signal therefrom can be implemented by a QB-node control unit that can control a QB-node.

The QB-node control unit may include a first capacitor connected between the QP-node and an input terminal inputting a second clock signal.

The QB-node control unit may include a second capacitor connected between the QB-node and an input terminal being applied a gate-high voltage.

The first transistor may be controlled by a start signal, the second transistor may be controlled by a first clock signal, and an electrode of each of the first transistor and the second transistor may be connected to an input terminal being applied a gate-high voltage.

The third transistor may be controlled by the start signal

The gate driver may further include a pull-up transistor. The first transistor is controlled by a voltage applied to a gate electrode of the pull-up transistor. The second transistor is controlled by a first clock signal. And an electrode of each of the first transistor and the second transistor is connected to an input terminal being applied a gate-high voltage.

The third transistor may be controlled by a start signal or a voltage input to a gate electrode of the pull-up transistor.

The first transistor may be controlled by a start signal, the second transistor may be controlled by a first clock signal, an electrode of the first transistor may be connected to an input terminal being applied a gate-high voltage, and an electrode of the second transistor may be connected to an output terminal outputting an output signal of the gate driver.

A gate electrode of the third transistor may be connected to an input terminal inputting a start signal or a gate electrode of the pull-up transistor.

It will be apparent to those skilled in the art that various modifications and variations can be made in the gate driver and display panel having the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driver, comprising:
   a QB-node control unit configured to control a QB-node, the QB-node being a gate node of a pull-down transistor, the QB-node control unit comprising:
      a first transistor and a second transistor, each having an electrode connected to a QP-node for controlling the QP-node;
      a third transistor configured to apply a gate-off voltage to the QB-node;
      a fourth transistor having a gate electrode connected to the QP-node, the fourth transistor being configured to apply a second clock signal to the QB-node; and
      a first capacitor connected between the QP-node and an input terminal inputting the second clock signal,
   wherein the first transistor is controlled by a start signal,
   wherein the second transistor is controlled by a first clock signal,
   wherein an electrode of the first transistor is connected to an input terminal being applied the gate-off voltage,
   wherein an electrode of the second transistor is directly connected to an output terminal outputting an output signal of the gate driver,
   wherein a gate electrode of the third transistor and a gate electrode of the first transistor are directly connected to an input terminal inputting the start signal, and
   wherein the second transistor is turned on, such that the output signal of the gate driver is applied to the QP-node, and the fourth transistor is turned on, such that the second clock signal is applied to the QB-node, while the output signal of the gate driver is a gate-on voltage.

2. The gate driver of claim 1, wherein the QB-node control unit further comprises a second capacitor connected between the QB-node and an input terminal being applied a gate-off voltage.

3. The gate driver of claim 1, further comprises a fifth transistor configured to apply a gate-on voltage to the gate electrode of the pull-up transistor.

4. The gate driver of claim 1, further comprises a sixth transistor controlled by the QB-node, the sixth transistor being connected between the gate of the pull-up transistor and an input terminal being applied a gate-off voltage.

5. The gate driver of claim 3, further comprises a seventh transistor controlled by an input terminal being applied a gate-on voltage, the seventh transistor being configured to divide a node connected to the gate electrode of the pull-up transistor into a Q1-node and a Q2 node.

6. The gate driver of claim 1, further comprises a third capacitor connected between the gate electrode of the pull-up transistor and an output terminal outputting an output signal of the gate driver.

* * * * *